(12) United States Patent
Noguchi et al.

(10) Patent No.: US 10,042,133 B2
(45) Date of Patent: Aug. 7, 2018

(54) OPTICAL MODULE

(71) Applicant: Oclaro Japan, Inc., Sagamihara, Kanagawa (JP)

(72) Inventors: Daisuke Noguchi, Kanagawa (JP); Sachiko Mizuseki, Kanagawa (JP); Norimichi Shibuya, Kanagawa (JP); Hiroshi Yamamoto, Tokyo (JP)

(73) Assignee: Oclaro Japan, Inc., Sagamihara (JP)

( * ) Notice: Subject to any disclaimer, the term of this patent is extended or adjusted under 35 U.S.C. 154(b) by 0 days.

(21) Appl. No.: 15/339,979

(22) Filed: Nov. 1, 2016

(65) Prior Publication Data

US 2017/0139160 A1 May 18, 2017

(30) Foreign Application Priority Data

Nov. 12, 2015 (JP) .................. 2015-222453

(51) Int. Cl.
*G02B 6/42* (2006.01)
*G01J 1/44* (2006.01)
(52) U.S. Cl.
CPC .............. *G02B 6/428* (2013.01); *G01J 1/44* (2013.01); *G02B 6/4279* (2013.01); *G02B 6/4283* (2013.01)
(58) Field of Classification Search
CPC .... G02B 6/428; G02B 6/4283; G02B 6/4284; G02B 6/4279; G02B 6/4277; G01J 1/44; H05K 1/02; H05K 1/0215; H05K 1/0216; H05K 1/0218; H05K 1/0224; H05K 1/0225; H05K 1/0237; H05K 1/0243; H05K 1/0245; H05K 1/025
See application file for complete search history.

(56) References Cited

U.S. PATENT DOCUMENTS

| 6,911,880 | B2* | 6/2005 | Arai ................... H01P 1/202 333/181 |
| 7,264,405 | B2* | 9/2007 | Ikeuchi ............. G02B 6/4201 385/53 |
| 7,696,628 | B2* | 4/2010 | Ikeuchi ............... H01P 1/047 257/775 |
| 7,719,378 | B2* | 5/2010 | Blair ................... H01P 3/006 333/1 |

(Continued)

FOREIGN PATENT DOCUMENTS

JP     2007-207803 A    8/2007

*Primary Examiner* — John Lee
(74) *Attorney, Agent, or Firm* — Mattingly & Malur, PC

(57) ABSTRACT

A first conductive layer includes a first signal wiring including, at a position except for an end portion, a wide portion having a width wider than that of the other portion. A second conductive layer includes a signal electrode electrically continuous with the end portion of the first signal wiring, a first ground plane overlapping the wide portion, and a ground terminal. A third conductive layer includes a second signal wiring including an end portion overlapping and bonded to the signal electrode, and a ground electrode overlapping and bonded to the ground terminal. A fourth conductive layer includes a second ground plane. The second ground plane includes a through hole overlapping the end portion of the second signal wiring. A fifth conductive layer includes a third groundplane. The third groundplane overlaps the end portion of the second signal wiring inside the through hole.

8 Claims, 13 Drawing Sheets

(56) References Cited

U.S. PATENT DOCUMENTS

| | | | | |
|---|---|---|---|---|
| 8,611,094 B2 * | 12/2013 | Aruga | ................... | G02B 6/4281 |
| | | | | 174/268 |
| 8,655,119 B2 * | 2/2014 | Yagisawa | ............. | G02B 6/4201 |
| | | | | 385/14 |
| 8,884,644 B1 * | 11/2014 | Ben Artsi | ............... | H01P 3/026 |
| | | | | 326/30 |
| 9,124,037 B2 * | 9/2015 | Smink | ................ | H01R 13/6461 |
| 9,386,692 B2 * | 7/2016 | Su | .......................... | H05K 1/028 |
| 9,502,744 B2 * | 11/2016 | Wu | ......................... | H01P 3/026 |
| 9,509,118 B2 * | 11/2016 | Firth | ................... | H01S 5/02216 |
| 9,544,059 B2 * | 1/2017 | Goto | ................... | H05K 1/0274 |
| 9,590,288 B2 * | 3/2017 | Saji | ....................... | H05K 1/025 |
| 9,668,346 B2 * | 5/2017 | Shirao | ................... | H05K 1/118 |
| 9,748,664 B2 * | 8/2017 | Kawamura | ........ | H01Q 21/0075 |
| 2004/0264882 A1 * | 12/2004 | Torigoe | ............... | G02B 6/4201 |
| | | | | 385/88 |
| 2012/0114340 A1 * | 5/2012 | Sugiyama | ............ | G02B 6/4201 |
| | | | | 398/200 |
| 2012/0138340 A1 * | 6/2012 | Kato | ...................... | H05K 1/028 |
| | | | | 174/251 |
| 2012/0229998 A1 * | 9/2012 | Kagaya | ..................... | H01P 1/02 |
| | | | | 361/777 |
| 2012/0274423 A1 * | 11/2012 | Kato | .................. | H01P 1/20363 |
| | | | | 333/238 |
| 2017/0139160 A1 * | 5/2017 | Noguchi | ................ | G02B 6/428 |

* cited by examiner

OPTICAL MODULE

CROSS-REFERENCE TO RELATED APPLICATION

The present application claims priority from Japanese application JP2015-222453 filed on Nov. 12, 2015, the content of which is hereby incorporated by reference into this application.

BACKGROUND OF THE INVENTION

1. Field of the Invention

The present invention relates to an optical module.

2. Description of the Related Art

An optical module has generally a form in which a printed circuit board (hereinafter PCB) on which an optical subassembly, a driver IC that outputs a modulated electric signal, and the like are mounted is included in the interior of the optical module. The housing of the optical subassembly accommodates an optical semiconductor device and is connected with a flexible printed board (hereinafter FPC).

With the widespread use of broadband networks in recent years, an increase in speed, a reduction in size, and a reduction in cost of the optical module are achieved. For reducing the size of the optical module, not only the size of the optical subassembly but also the size of a peripheral integrated circuit (IC) or PCB need to be reduced. For reducing the size of the IC, a recent IC package is provided as being of a ball grid array (BGA) type in which a ball pitch is set to approximately 0.5 mm. Further, high-density packaging is realized using the form of full grid in which the grid on the mounting surface is entirely filled with terminals. However, since it is impossible to route wiring between balls with a 0.5 mm pitch, wiring needs to be connected using a multilayer wiring structure for terminals on the second row or on the inside thereof.

When vias of the multilayer wiring structure are formed using a drill, the land diameter is increased to thereby cause interference between the adjacent balls, and thus wiring cannot be routed to the terminals located inside the full grid. Therefore, the vias need to be formed using a laser so that the land diameter is small. The vias formed using the laser allow wiring to be routed to all the terminals of the full grid; however, the base material constituting the PCB is subjected to constraints such as the laser output or cost, and the design flexibility is also low for the thickness, permittivity, dielectric loss tangent, and the like of the base material.

Moreover, because of a request for an increase in speed in recent years, the demand for an optical module capable of transmitting a 25 Gbit/s-class high-speed electric signal is expanding. When the optical subassembly mounted on the FPC is connected using solder or the like to the PCB subjected to the constraints described above, the mismatch of characteristic impedance occurs at the connection point, causing enormous reflection of the electric signal and thus resulting in the problem of degraded quality in the waveform of the optical module.

Therefore, for reducing the mismatch of characteristic impedance, a reduction in characteristic impedance is prevented by removing GND directly below the connection portion of the FPC and the PCB in JP 2007-207803 A.

In the method such as proposed in JP 2007-207803 A, it is difficult to match the characteristic impedance to a desired value up to in the frequency range exceeding 20 GHz at the connection portion of the PCB and FPC reduced in size. Moreover, the characteristic impedance can be finely adjusted by adjusting the terminal width of the FPC connecting to the PCB; however, soldering workability is reduced, and thus the man-hour is increased.

SUMMARY OF THE INVENTION

It is an object of the invention to improve a reduction in reflection characteristic caused by characteristic impedance mismatch at a connection point of a multilayer substrate and a multilayer substrate.

(1) An optical module according to an aspect of the invention includes: an optical subassembly for converting an optical signal and an electric signal at least from one to the other; a first multilayer substrate electrically connected to the optical subassembly; and a second multilayer substrate partially overlapping and electrically connected to the first multilayer substrate, wherein the first multilayer substrate includes a first conductive layer and a second conductive layer, the second multilayer substrate includes a third conductive layer, a fourth conductive layer, and a fifth conductive layer, the first conductive layer includes a first signal wiring connected to the optical subassembly, the first signal wiring including, at a position except for an end portion, a wide portion having a width wider than that of the other portion, the second conductive layer includes a signal electrode electrically continuous with the end portion of the first signal wiring, a first ground plane overlapping the wide portion, and a ground terminal connected to the first ground plane, the third conductive layer includes a second signal wiring including an end portion overlapping and bonded to the signal electrode, and a ground electrode overlapping and bonded to the ground terminal, the fourth conductive layer includes a second ground plane electrically continuous with the ground electrode, the second ground plane including a through hole overlapping the end portion of the second signal wiring, and the fifth conductive layer includes a third ground plane electrically continuous with the second ground plane, the third ground plane overlapping the end portion of the second signal wiring inside the through hole. According to the aspect of the invention, the capacitance between the first signal wiring and the first ground plane is increased due to the wide portion in the first multilayer substrate. In the second multilayer substrate, the capacitance between the second signal wiring and the second ground plane is reduced due to the through hole, while the capacitance is provided between the second signal wiring and the third ground plane inside the through hole. With these increase and reduction in capacitance, a reflection characteristic caused by characteristic impedance mismatch is improved.

(2) The optical module according to (1), wherein the optical module may further include: a first insulating layer intervening between the first conductive layer and the second conductive layer; a second insulating layer intervening between the third conductive layer and the fourth conductive layer; a third insulating layer intervening between the fourth conductive layer and the fifth conductive layer; a first electrically continuous portion penetrating the first insulating layer to provide electrical continuity between the end portion of the first signal wiring and the signal electrode; a second electrically continuous portion penetrating the second insulating layer to provide electrical continuity between the ground electrode and the second ground plane; and a third electrically continuous portion penetrating the third insulating layer to provide electrical continuity between the second ground plane and the third ground plane.

(3) The optical module according to (1) or (2), wherein the through hole of the second ground plane may have a shape in which the width gradually narrows in a direction in which the second signal wiring extends from a tip thereof, and an overlapping area of the end portion of the second signal wiring and the second ground plane, which is adjacent to the through hole, may gradually increase in the direction in which the second signal wiring extends from the tip thereof.

(4) The optical module according to any one of (1) to (3), wherein the width of the end portion of the second signal wiring may be wider than that of the signal electrode.

(5) The optical module according to any one of (1) to (4), wherein the wide portion of the first signal wiring may be located at a position not overlapping the through hole of the second ground plane.

(6) The optical module according to any one of (1) to (5), wherein the wide portion of the first signal wiring may include a portion protruding from the first ground plane.

(7) The optical module according to any one of (1) to (6), wherein the second signal wiring may include a pair of second signal wirings, and the through hole may be formed to avoid overlapping at least a portion of an area between end portions of the pair of second signal wirings.

(8) The optical module according to any one of (1) to (7), wherein the end portion of the second signal wiring and the signal electrode may have bonding areas that are bonded to each other, the bonding areas may have a length along the first signal wiring, and the first signal wiring may include the wide portion adjacent to the bonding area and within a range of a length smaller than or equal to the length.

DETAILED DESCRIPTION OF THE INVENTION

Figure 1:
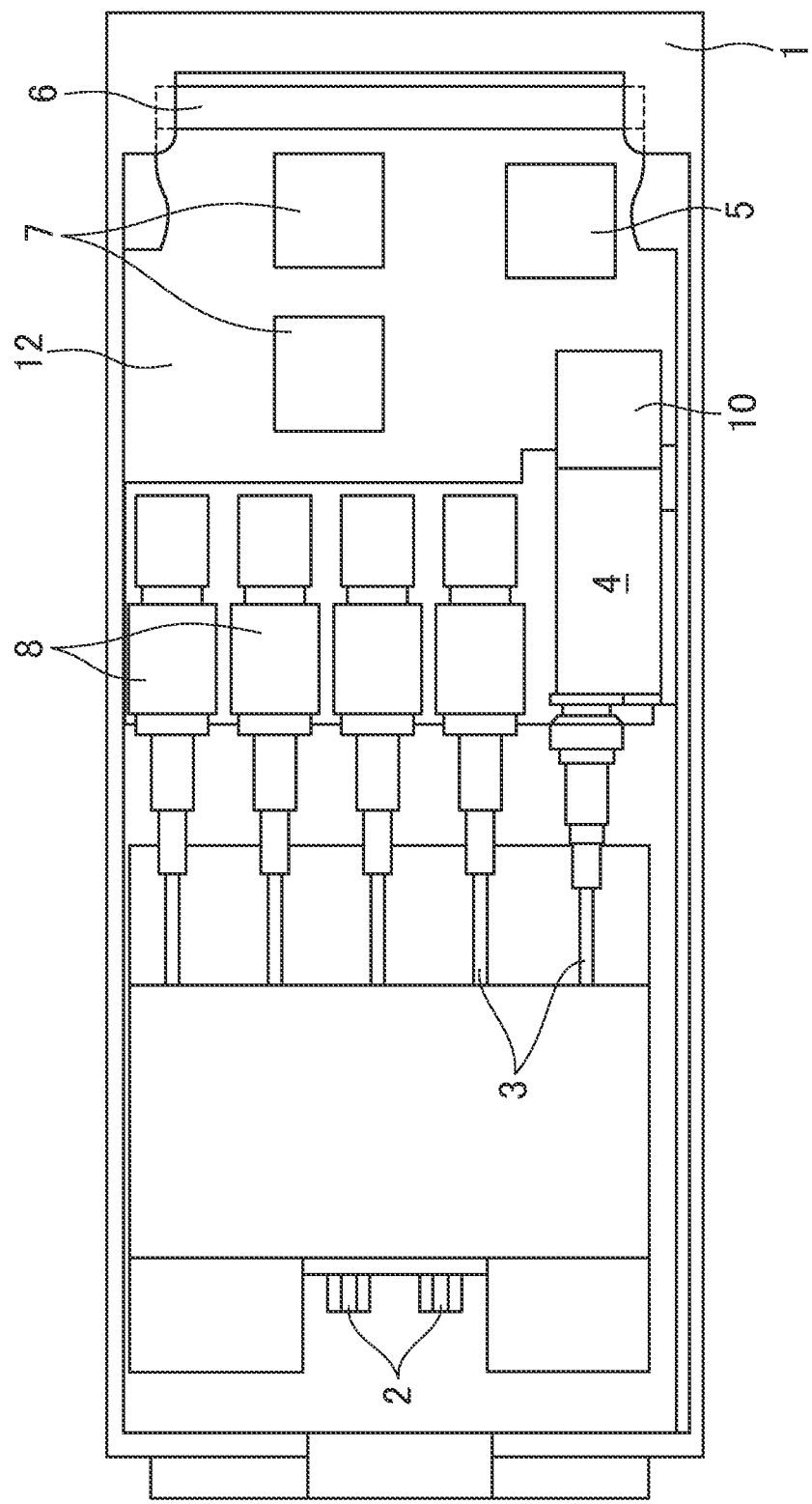
FIG. 1 is a plan view of an optical module according to an embodiment of the invention.

Hereinafter, an embodiment of the invention will be described with reference to the drawings. In the drawings, the same or equivalent elements are denoted by the same reference numerals and signs, and a redundant description is omitted.

FIG. 1 is a plan view showing an overview of an optical module according to the embodiment of the invention. As the optical module, an optical transceiver module is taken as an example. FIG. 1 shows the optical transceiver module in the state where the upper plate of a housing 1 is removed. Optical signals input from optical receptacles 2 of the optical transceiver module pass through an optical fiber 3 and are converted to electric signals by an optical receiver component 4 (receiver optical subassembly (ROSA)).

The electric signals of high frequency output by the optical receiver component 4 are amplified by an electrical high-frequency component 5 (amplifier) and output to a device connected to a card edge connector 6.

Moreover, electric signals input from the device connected to the card edge connector 6 are amplified by electrical high-frequency components 7 (amplifiers) and converted to optical signals by optical transmitter components 8 (transmitter optical subassemblies (TOSAs)). The optical signals converted by the optical transmitter components 8 are output from the optical receptacles 2 through optical fibers 3 and a multiplexer. The optical receiver component 4 and the optical transmitter component 8 are examples of an optical subassembly for converting an optical signal and an electric signal at least from one to the other.

Figure 2:
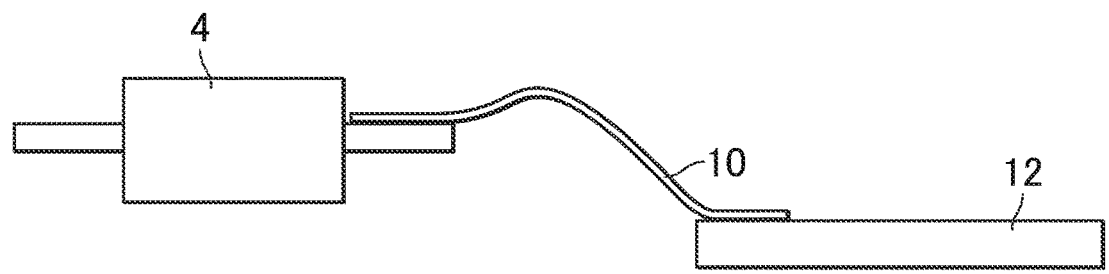
FIG. 2 is a diagram showing the connection of a first multilayer substrate and a second multilayer substrate.

FIG. 2 is a diagram showing the connection of the optical subassembly, a first multilayer substrate, and a second multilayer substrate. The optical receiver component 4 as one example of the optical subassembly is connected to one of the edge portions of the first multilayer substrate 10. The first multilayer substrate 10 partially overlaps and is electrically connected to the second multilayer substrate 12 on which the electrical high-frequency component 5 shown in FIG. 1 is mounted. The thickness and permittivity of base materials for the first multilayer substrate 10 and the second multilayer substrate 12 are designed so that the differential output impedance is set to 50 ohms, but a structure for controlling the impedance at the connection portion is further needed. Hereinafter, the structures of the first multilayer substrate 10 and the second multilayer substrate 12 will be described.

Figure 3:
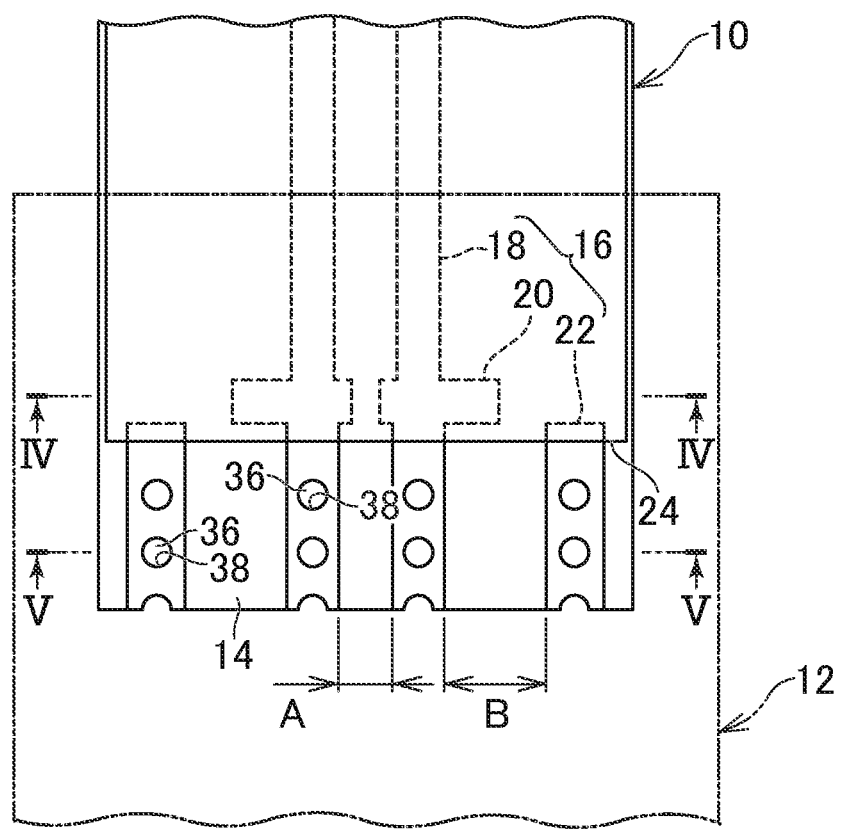
FIG. 3 is a plan view showing the first multilayer substrate.
Figure 4:
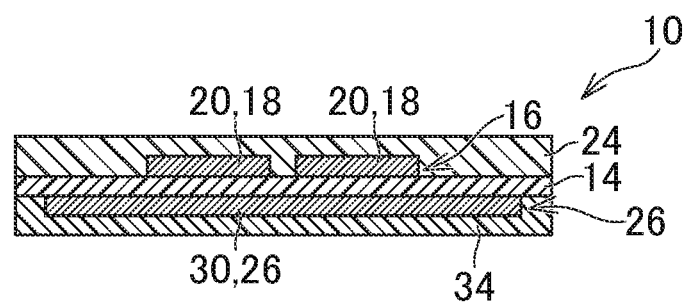
FIG. 4 is a cross-sectional view of the first multilayer substrate shown in FIG. 3, taken along line IV-IV.
Figure 5:
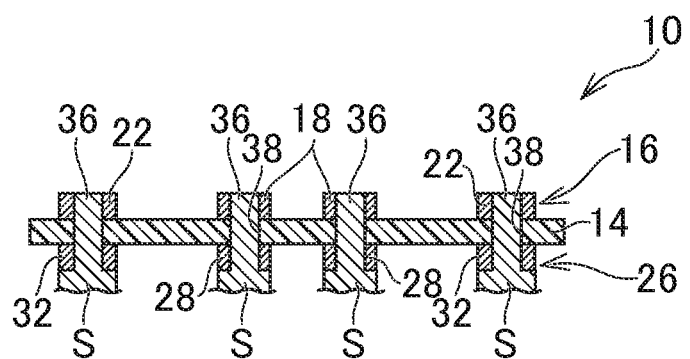
FIG. 5 is a cross-sectional view of the first multilayer substrate shown in FIG. 3, taken along line V-V.

FIG. 3 is a plan view showing the first multilayer substrate 10. FIG. 4 is a cross-sectional view of the first multilayer substrate 10 shown in FIG. 3, taken along line IV-IV. FIG. 5 is a cross-sectional view of the first multilayer substrate 10 shown in FIG. 3, taken along line V-V.

The first multilayer substrate 10 is, for example, a flexible printed board, and includes a first insulating layer 14 as a base material. A first conductive layer 16 is formed on one of the faces of the first insulating layer 14. The first conductive layer 16 includes first signal wirings 18. The pair of first signal wirings 18 constitute a differential line. The first signal wirings 18 are connected to the optical subassembly (not shown). The first signal wiring 18 includes, at a position except for the end portion, a wide portion 20 having a width (the size in a direction orthogonal to the extending direction) wider than that of the other portion. The wide portion 20 extends larger on one side of a wiring line in the width direction than on the other side. In the example of FIG. 3, the wide portion 20 projects from the wiring line to be large in the direction in which the pair of first signal wirings 18 are away from each other and to be small in the direction in which the pair of first signal wirings 18 are close to each other.

The first conductive layer 16 includes connection electrodes 22 that are electrically continuous with ground terminals 32 described later. The pair of connection electrodes 22 are located at positions interposing the pair of first signal wirings 18 therebetween. A gap A between the pair of first signal wirings 18 is smaller than a gap B between the connection electrode 22 and the first signal wiring 18. The effect will be described later with reference to FIG. 12. A first protective layer 24 is provided so as to cover the first signal wirings 18 (especially the wide portions 20). The first protective layer 24 is provided to avoid the end portions of the first signal wirings 18, and provided to avoid at least portions of the connection electrodes 22.

Figure 6:
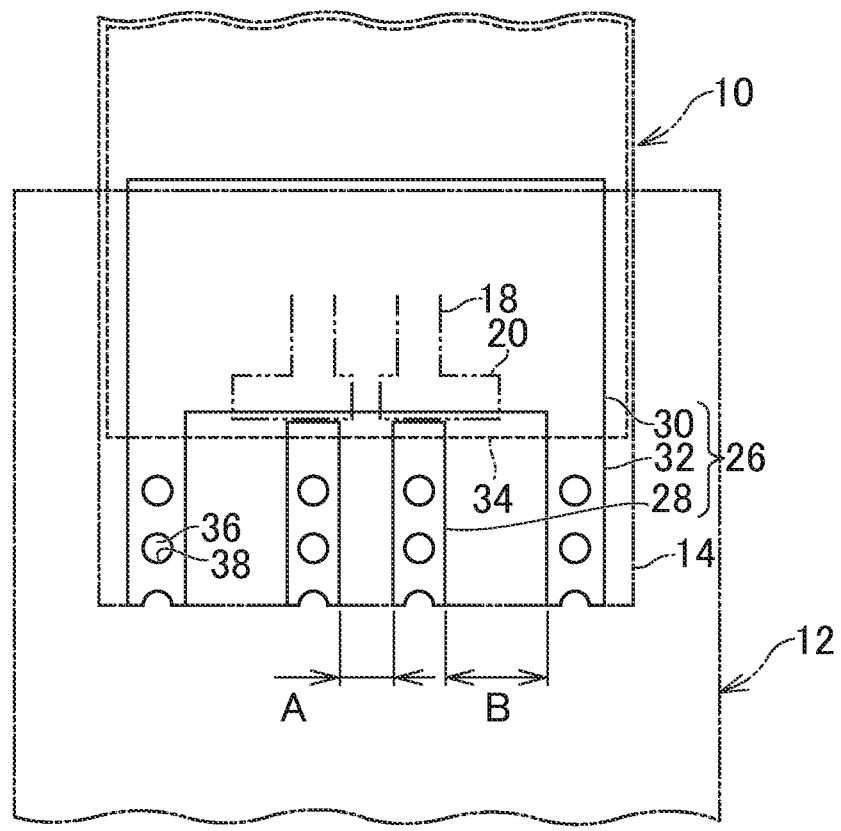
FIG. 6 is a diagram showing a second conductive layer of the first multilayer substrate.

FIG. 6 is a diagram showing a second conductive layer 26 of the first multilayer substrate 10. The first multilayer substrate 10 includes the second conductive layer 26. The first insulating layer 14 intervenes between the first conductive layer 16 and the second conductive layer 26. The second conductive layer 26 includes signal electrodes 28. The signal electrode 28 is electrically continuous with the end portion of the first signal wiring 18. The signal electrode 28 and the first signal wiring 18 coincide in width with each other, and thus the gap A between the pair of signal electrodes 28 (FIG. 6) is the same as the gap A between the pair of first signal wirings 18 (FIG. 3).

The second conductive layer 26 includes a first ground plane 30. The first signal wiring 18 and the first ground plane 30 with the first insulating layer 14 therebetween constitute a microstrip line. As shown in FIG. 6, the first ground plane 30 overlaps the wide portions 20. However, the wide portion 20 of the first signal wiring 18 includes a portion that protrudes from the first ground plane 30. The ground terminals 32 are connected to the first ground plane 30. As shown in FIG. 5, the ground terminal 32 overlaps the connection electrode 22 and coincides in width with the connection electrode 22. The gap B between the ground terminal 32 and the signal electrode 28 (FIG. 6) is the same as the gap B between the connection electrode 22 and the first signal wiring 18 (FIG. 3). The gap A between the pair of signal electrodes 28 is smaller than the gap B between the ground terminal 32 and the signal electrode 28. The effect will be described later with reference to FIG. 12.

A second protective layer 34 is provided so as to cover the first ground plane 30 (especially the entire portion except for the ground terminals 32). The second protective layer 34 is provided to avoid the end portions of the signal electrodes 28, and provided to avoid at least portions of the ground terminals 32.

As shown in FIG. 5, first electrically continuous portions 36 are each provided to penetrate the first insulating layer 14 for providing electrical continuity between the end portion of the first signal wiring 18 and the signal electrode 28 and providing electrical continuity between the connection electrode 22 and the ground terminal 32. Specifically, in positions exposed from the first protective layer 24 shown in FIG. 3, first through holes 38 each penetrating the end portion of the first signal wiring 18, the connection electrode 22, and the first insulating layer 14 are formed, and solder S that is melted and poured into the first through holes 38 is cured to provide the first electrically continuous portions 36. Similarly, in positions exposed from the first protective layer 24, first through holes 38 each penetrating the connection electrode 22, the ground terminal 32, and the first insulating layer 14 are formed, and solder S that is melted and poured into the first through holes 38 is cured to provide the first electrically continuous portions 36.

The solder S constituting the first electrically continuous portion 36 wet-spreads, during melting, and is cured on the second conductive layer 26 (the signal electrode 28 and the ground terminal 32) within the range exposed from the second protective layer 34 shown in FIG. 6 (see FIG. 5). The solder S bonds the signal electrode 28 and the ground terminal 32 with a third conductive layer 40 described later.

Figure 7:
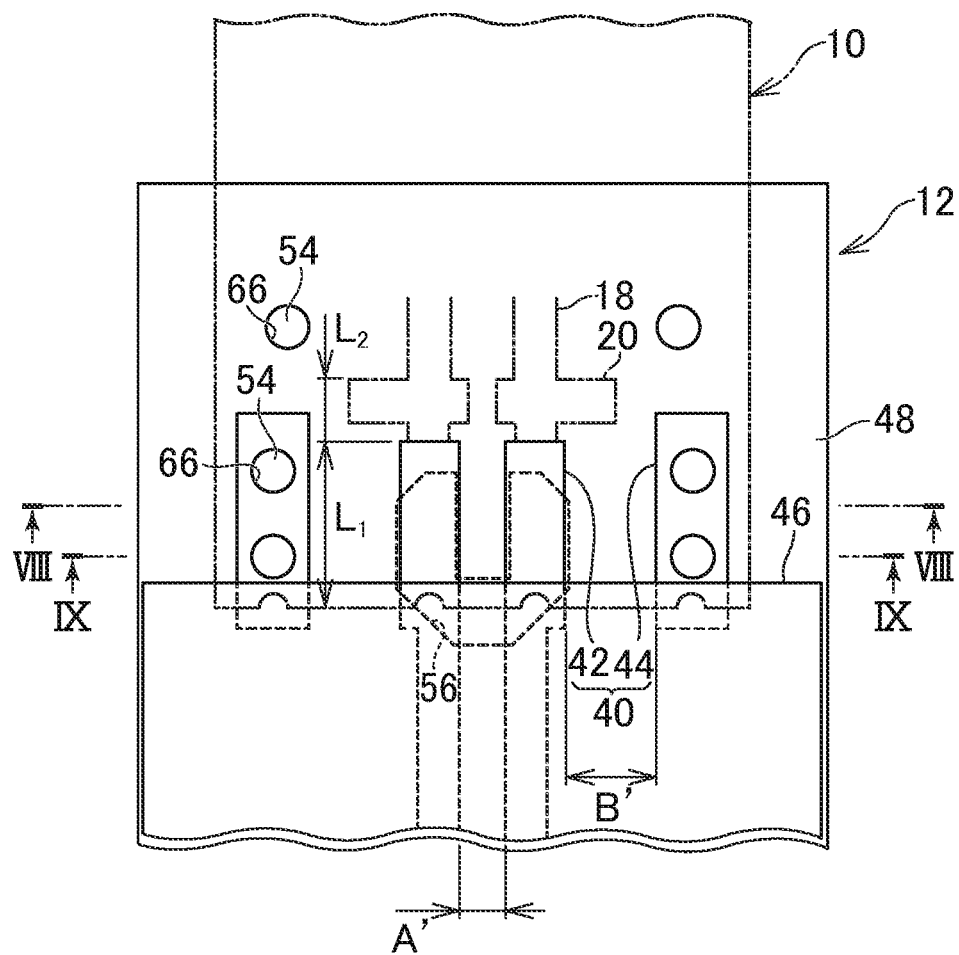
FIG. 7 is a plan view showing the second multilayer substrate.
Figure 8:
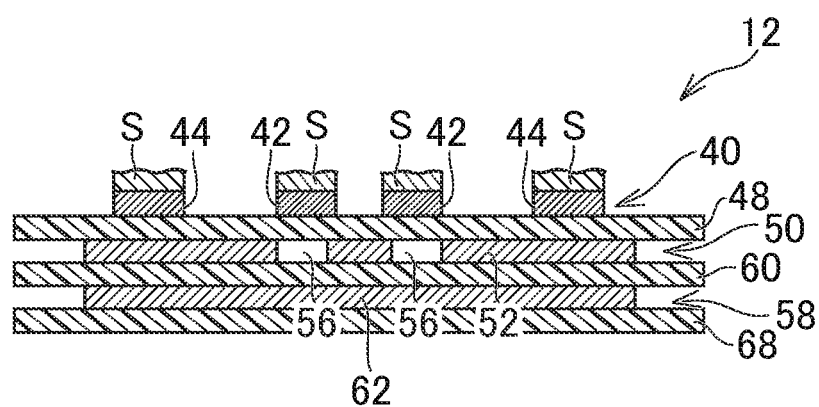
FIG. 8 is a cross-sectional view of the second multilayer substrate shown in FIG. 7, taken along line VIII-VIII.
Figure 9:
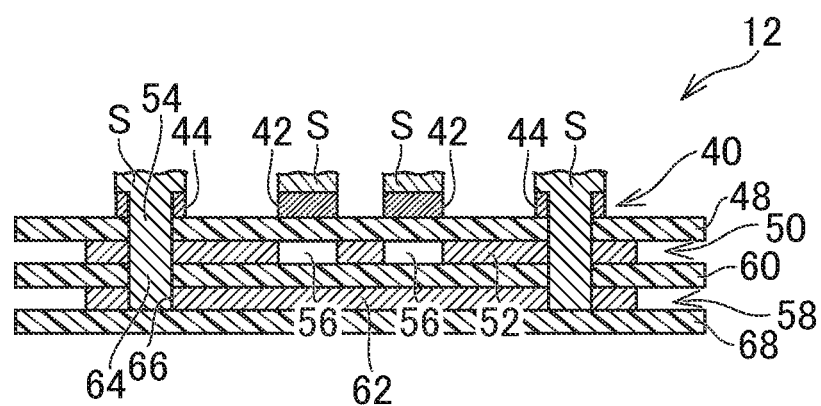
FIG. 9 is a cross-sectional view of the second multilayer substrate shown in FIG. 7, taken along line IX-IX.

FIG. 7 is a plan view showing the second multilayer substrate 12. FIG. 8 is a cross-sectional view of the second multilayer substrate 12 shown in FIG. 7, taken along line VIII-VIII. FIG. 9 is a cross-sectional view of the second multilayer substrate 12 shown in FIG. 7, taken along line IX-IX.

The second multilayer substrate 12 partially overlaps and is electrically connected to the first multilayer substrate 10. The second multilayer substrate 12 is, for example, a printed wiring board, and examples thereof include a rigid substrate. The second multilayer substrate 12 includes the third conductive layer 40. The third conductive layer 40 includes second signal wirings 42. The pair of second signal wirings 42 constitute a differential line. The second signal wirings 42 are connected to the electrical high-frequency components 5 and 7 (see FIG. 1) mounted on the second multilayer substrate 12. The width of the second signal wiring 42 is wider at the end portion than at a wiring line located on the near side of the end portion.

The third conductive layer 40 includes ground electrodes 44. The pair of ground electrodes 44 are located at positions interposing the pair of second signal wirings 42 therebetween. A gap A' between the pair of second signal wirings 42 is smaller than a gap B' between the end portion of the second signal wiring 42 and the ground electrode 44. The effect will be described later with reference to FIG. 12. A third protective layer 46 is provided so as to cover the second signal wirings 42. The third protective layer 46 is provided to avoid the end portions of the second signal wirings 42, and provided to avoid at least portions of the ground electrode 44.

The end portion of the second signal wiring 42 overlaps and is bonded to the signal electrode 28 (FIG. 6). The signal electrode 28 and the end portion of the second signal wiring 42 are bonded together with the solder S described above (see FIG. 9). The end portion of the second signal wiring 42 and the signal electrode 28 have bonding areas that are bonded to each other.

The bonding areas of the second signal wiring 42 and the signal electrode 28 have a length $L_1$ along the first signal wiring 18 (or the second signal wiring 42) as shown in FIG. 7. The first signal wiring 18 includes the wide portion 20 adjacent to the bonding area and within a length L2 smaller than or equal to the length $L_1$ as shown in FIG. 7. The width of the end portion of the second signal wiring 42 in the bonding area is wider than that of the signal electrode 28. Therefore, the gap A' between the pair of second signal wirings 42 (FIG. 7) is narrower than the gap A between the pair of signal electrodes 28 (FIG. 6).

The ground electrode 44 (FIG. 7) overlaps and is bonded to the ground terminal 32 (FIG. 6). The end portion of the second signal wiring 42 and the signal electrode 28 have bonding areas that are bonded to each other, and the width of the ground electrode 44 is wider than that of the ground terminal 32 in the bonding area. Therefore, the gap B' between the end portion of the second signal wiring 42 and the ground electrode 44 (FIG. 7) is narrower than the gap B between the signal electrode 28 and the ground terminal 32

(FIG. 6). The ground electrode 44 and the ground terminal 32 are bonded together with the solder S described above (FIGS. 5 and 9).

The second multilayer substrate 12 includes a second insulating layer 48 as a base material. The third conductive layer 40 is formed on one of the faces of the second insulating layer 48, while a fourth conductive layer 50 is formed on the other face. The second insulating layer 48 intervenes between the third conductive layer 40 and the fourth conductive layer 50.

Figure 10:
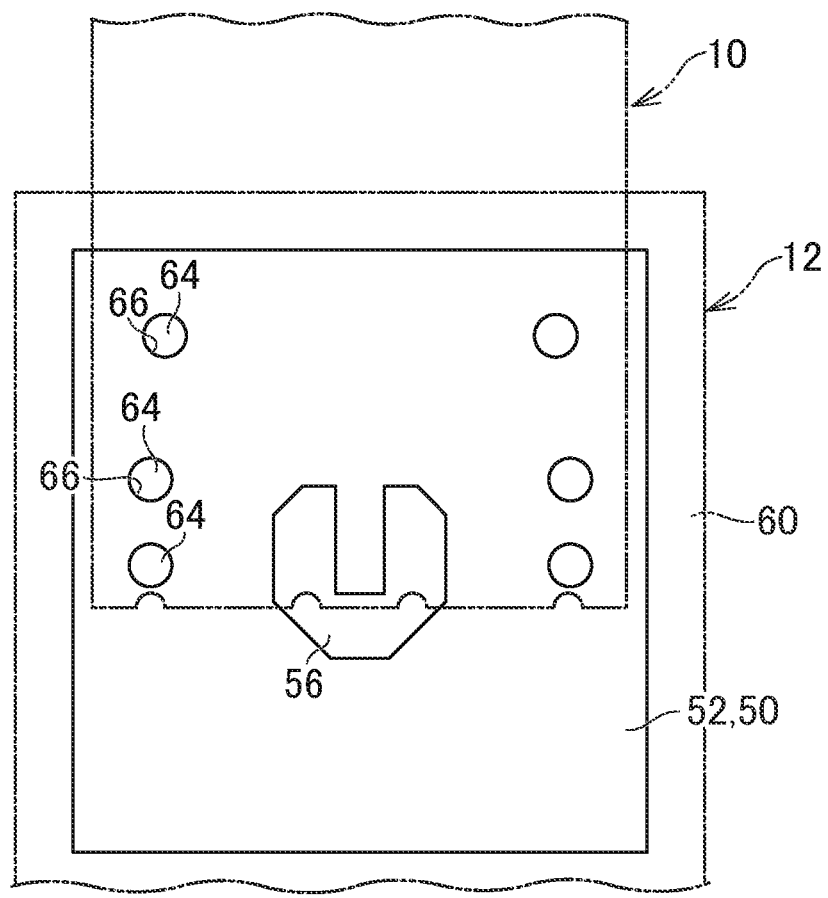
FIG. 10 is a diagram showing a fourth conductive layer of the second multilayer substrate.

FIG. 10 is a diagram showing the fourth conductive layer 50 of the second multilayer substrate 12. The fourth conductive layer 50 includes a second ground plane 52. As shown in FIG. 9, the second signal wiring 42 and the second ground plane 52 constitute a microstrip line. The second ground plane 52 is electrically continuous with the ground electrode 44. For providing electrical continuity between the second ground plane 52 and the ground electrodes 44, second electrically continuous portions 54 are provided to penetrate the second insulating layer 48.

The second ground plane 52 includes a through hole 56. Unlike a notch, the through hole 56 has a shape in which the periphery thereof is continuously surrounded by the material of the second ground plane 52 (FIG. 10). The through hole 56 overlaps the end portions of the second signal wirings 42 as shown in FIG. 7. The end portions of the second signal wirings 42 are located inside the through hole 56. The through hole 56 is formed to avoid overlapping at least a portion of the area between the end portions of the pair of second signal wirings 42. That is, the material of the second ground plane 52 is present between the end portions of the pair of second signal wirings 42. At the end portions of the pair of second signal wirings 42, the side portions thereof facing each other protrude from the through hole 56. That is, the inner edge of the through hole 56 is located in the areas of the end portions of the second signal wirings 42.

The through hole 56 of the second ground plane 52 has a shape in which the width gradually narrows in a direction in which the second signal wiring 42 extends from the tip thereof (downward in FIG. 7). The end portion of the second signal wiring 42 and the second ground plane 52 have an overlapping area adjacent to the through hole 56. This overlapping area gradually increases in the direction in which the second signal wiring 42 extends from the tip thereof. As shown in FIG. 7, the wide portion 20 of the first signal wiring 18 is located at a position not overlapping the through hole 56 of the second ground plane 52.

Figure 11:
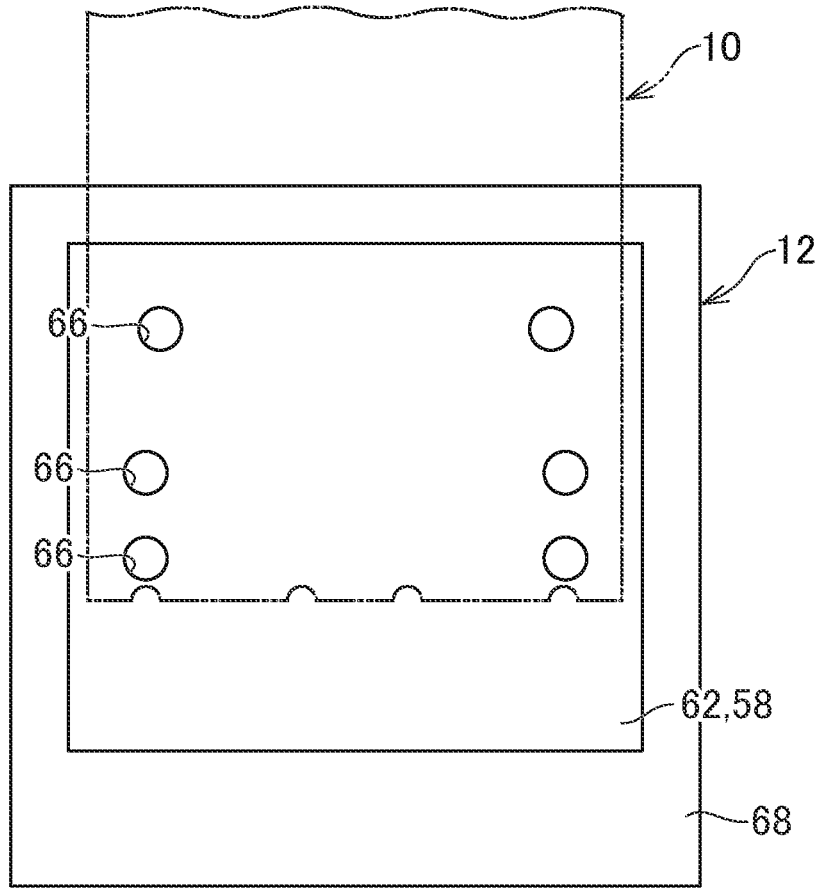
FIG. 11 is a diagram showing a fifth conductive layer of the second multilayer substrate.

FIG. 11 is a diagram showing a fifth conductive layer 58 of the second multilayer substrate 12. The second multilayer substrate 12 includes the fifth conductive layer 58. A third insulating layer 60 intervenes between the fourth conductive layer 50 and the fifth conductive layer 58. The fifth conductive layer 58 includes a third ground plane 62. The third ground plane 62 overlaps the end portions of the second signal wirings 42 inside the through hole 56 shown in FIG. 10 (FIG. 9). The third ground plane 62 is electrically continuous with the second ground plane 52. Third electrically continuous portions 64 are provided to penetrate the third insulating layer 60 to provide electrical continuity between the second ground plane 52 and the third ground plane 62.

In positions exposed from the third protective layer 46, second through holes 66 each penetrating the ground electrode 44, the second insulating layer 48, the second ground plane 52, the third insulating layer 60, and the third ground plane 62 are formed as shown in FIG. 9, and the solder S that is melted and poured into the second through holes 66 is cured to provide the second electrically continuous portions 54 and the third electrically continuous portions 64. The second electrically continuous portion 54 and the third electrically continuous portion 64 may be configured continuously using the solder S constituting the first electrically continuous portion 36 shown in FIG. 5 during melting. A fourth protective layer 68 is provided on the face of the third ground plane 62 on the side opposite to the third insulating layer 60.

According to the embodiment, the capacitance between the first signal wiring 18 and the first ground plane 30 is increased due to the wide portion 20 in the first multilayer substrate 10 (FIG. 4). In the second multilayer substrate 12 as shown in FIG. 9, the capacitance between the second signal wiring 42 and the second ground plane 52 is reduced due to the through hole 56, while the capacitance is provided between the second signal wiring 42 and the third ground plane 62 inside the through hole 56. With these increase and reduction in capacitance, a reflection characteristic caused by characteristic impedance mismatch is improved.

Figure 12:
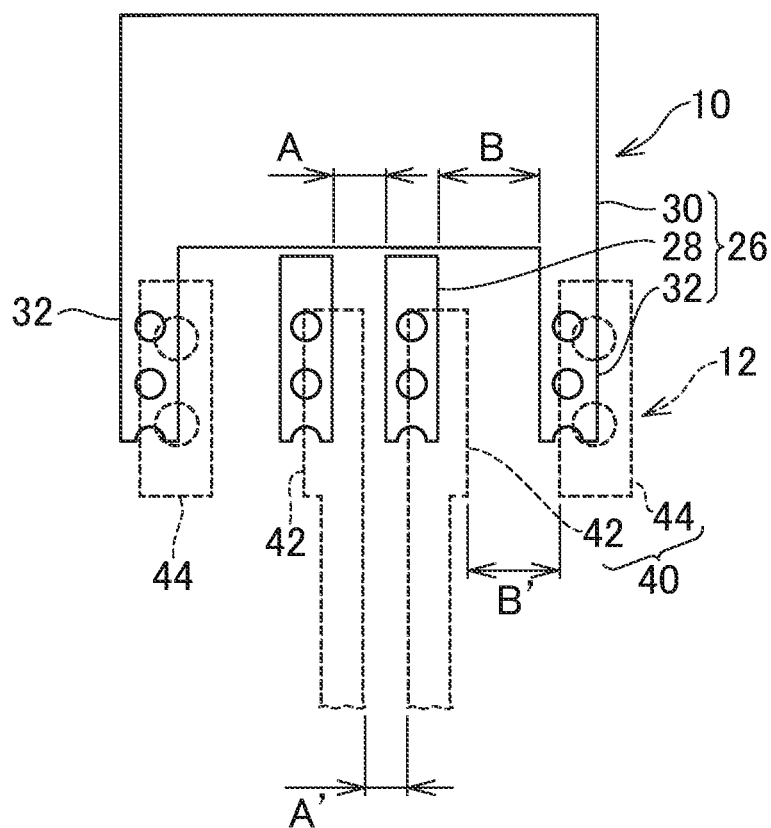
FIG. 12 is a diagram for explaining the bonding state of the second conductive layer and a third conductive layer.

FIG. 12 is a diagram for explaining the bonding state of the second conductive layer 26 and the third conductive layer 40. As described above, the signal electrode 28 and the ground terminal 32 of the first multilayer substrate 10 are bonded respectively to the second signal wiring 42 and the ground electrode 44 of the second multilayer substrate 12. A signal connection portion including the signal electrode 28 and the second signal wiring 42 and a ground connection portion including the ground terminal 32 and the ground electrode 44 may be shifted in position in the width direction thereof. If the signal connection portion and the ground connection portion come close to each other because of the shift, the mismatch of impedance occurs.

In the embodiment, the gap A between the pair of signal electrodes 28 is smaller than the gap B between the ground terminal 32 and the signal electrode 28. The gap A' between the pair of second signal wirings 42 is smaller than the gap B' between the end portion of the second signal wiring 42 and the ground electrode 44. With this configuration, since the signal connection portion and the ground connection portion are separate from each other, the influence on effective impedance can be reduced.

Example

An optical module using a directly modulated TOSA is not provided with a termination resistor due to a power consumption constraint, and is terminated with an optical semiconductor device having a low resistance value (8 to 12 ohms). Therefore, a high-frequency electric signal is reflected by the optical semiconductor device and travels back toward the second multilayer substrate 12 on which a drive device is mounted. No problem occurs when the reflected wave traveling back toward the second multilayer substrate 12 can be guided to a termination resistor of the drive device without being further reflected by the connection portion of the first multilayer substrate 10 and the second multilayer substrate 12; however, multiple reflection becomes obvious in a high-frequency line when the reflected wave is reflected by the connection portion, which degrades the quality of an optical waveform.

For 25-GHz high-speed operation, it is necessary to reduce a reflection characteristic S11 at the connection portion of the first multilayer substrate 10 and the second multilayer substrate 12 to −20 dB or less in the frequency range up to 30 GHz at which the optical semiconductor device makes a response, and to −10 dB or less in the frequency range from 30 GHz to 40 GHz in which the response of the device starts to degrade.

In this example, simulations have been performed on how the reflection characteristic S11 varies depending on the presence or absence of the wide portion 20 of the first signal wiring 18, the presence or absence of the through hole 56 of the second ground plane 52, and the presence or absence of the third ground plane 62 using a high-frequency three-dimensional electromagnetic field simulator (high frequency structure simulator (HFSS)).

Figure 13:
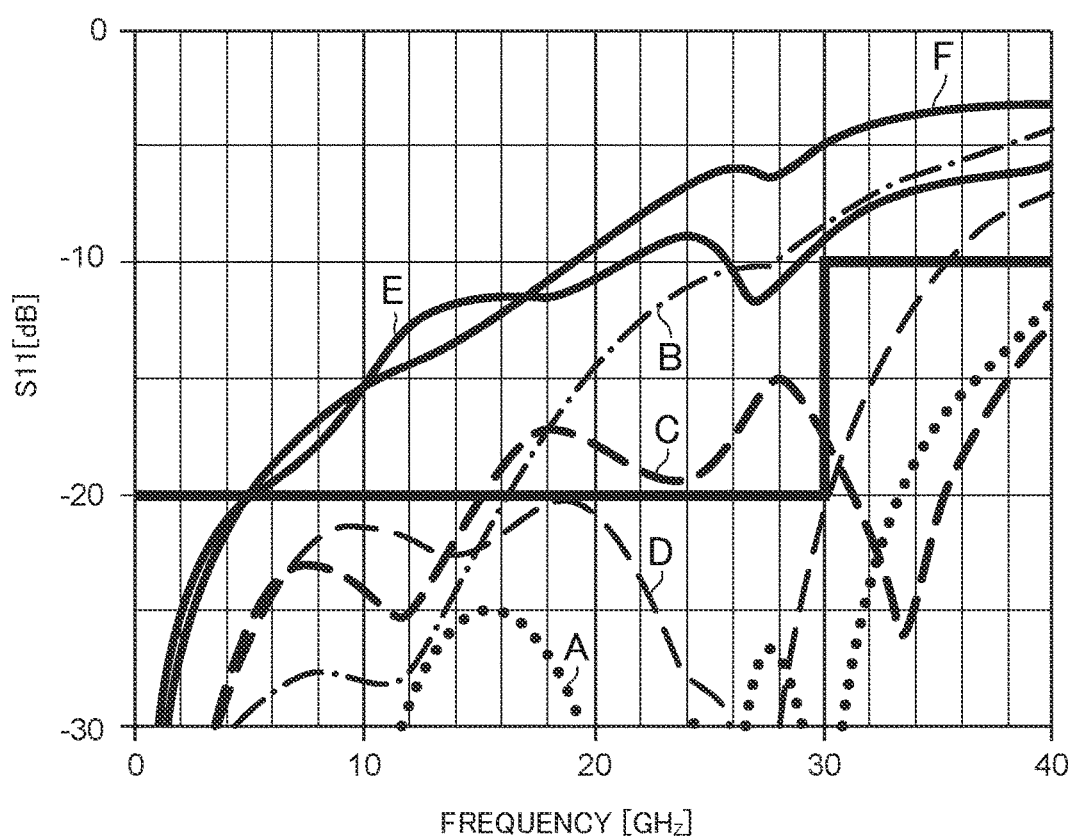
FIG. 13 is a graph showing comparison results of reflection characteristics.

FIG. 13 is a graph showing comparison results of reflection characteristics. A represents the case where the wide portion 20 is formed in the first signal wiring 18, the through hole 56 having the above-described planar shape is formed in the second ground plane 52, and the third ground plane 62 is provided so as to overlap the through hole 56 (i.e., an example to which the invention is applied).

B differs from A in that the wide portion 20 of the first signal wiring 18 is not provided.

C differs from A in that the third ground plane 62 is not provided.

D differs from A in that the wide portion 20 of the first signal wiring 18 and the third ground plane 62 are not provided.

E differs from A in that the through hole 56 of the second ground plane 52 is not provided.

F differs from A in that all of the wide portion 20 of the first signal wiring 18, the through hole 56 of the second ground plane 52, and the third ground plane 62 are not included.

As shown in FIG. 13, in the example (dotted line A) to which the invention is applied, it was possible to reduce the S11 at the connection portion of the first multilayer substrate 10 and the second multilayer substrate 12 to −20 dB or less in the frequency range up to 30 GHz at which the optical semiconductor device makes a response, and to −10 dB or less in the frequency range from 30 GHz to 40 GHz in which the response of the device starts to degrade. In B to F, it was impossible to achieve the target values.

In the example to which the invention is applied, the through hole 56 overlapping the end portions of the second signal wirings 42 was formed in the second ground plane 52, the third ground plane 62 overlapping the end portions of the second signal wirings 42 inside the through hole 56 was disposed, and the through hole 56 was formed in the above-described shape, so that characteristic impedance was finely adjusted; further, mismatch not sufficiently corrected in the high-frequency range was compensated for by providing the capacitance in the wide portion 20 formed in the first signal wiring 18.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module comprising:
   an optical subassembly for converting an optical signal and an electric signal at least from one to the other;
   a first multilayer substrate electrically connected to the optical subassembly; and
   a second multilayer substrate partially overlapping, in a planar view, and electrically connected to the first multilayer substrate, wherein
   the first multilayer substrate includes a first conductive layer and a second conductive layer,
   the second multilayer substrate includes a third conductive layer, a fourth conductive layer, and a fifth conductive layer,
   the first conductive layer includes a first signal wiring connected to the optical subassembly, the first signal wiring including, at a position except for an end portion, a wide portion having a width wider than that of another portion,
   the second conductive layer includes a signal electrode electrically continuous with the end portion of the first signal wiring, a first ground plane overlapping the wide portion, in the planar view, and a ground terminal connected to the first ground plane,
   the third conductive layer includes a second signal wiring including an end portion overlapping, in the planar view, and bonded to the signal electrode, and a ground electrode overlapping, in the planar view, and bonded to the ground terminal,
   the fourth conductive layer includes a second ground plane electrically continuous with the ground electrode, the second ground plane including a through hole overlapping, in the planar view, the end portion of the second signal wiring, and
   the fifth conductive layer includes a third ground plane electrically continuous with the second ground plane, the third ground plane overlapping, in the planar view, the end portion of the second signal wiring within the through hole in the planar view.

2. The optical module according to claim 1, further comprising:
   a first insulating layer intervening between the first conductive layer and the second conductive layer;
   a second insulating layer intervening between the third conductive layer and the fourth conductive layer;
   a third insulating layer intervening between the fourth conductive layer and the fifth conductive layer;
   a first electrically continuous portion penetrating the first insulating layer to provide electrical continuity between the end portion of the first signal wiring and the signal electrode;
   a second electrically continuous portion penetrating the second insulating layer to provide electrical continuity between the ground electrode and the second ground plane; and
   a third electrically continuous portion penetrating the third insulating layer to provide electrical continuity between the second ground plane and the third ground plane.

3. The optical module according to claim 1, wherein the wide portion of the first signal wiring includes a portion protruding from the first ground plane.

4. The optical module according to claim 1, wherein the end portion of the second signal wiring and the signal electrode have bonding areas that are bonded to each other,
   the bonding areas have a length along the first signal wiring, and
   the first signal wiring includes the wide portion adjacent to the bonding area and within a range of a length smaller than or equal to the above-described length.

5. The optical module according to claim 1, wherein the second signal wiring includes a pair of second signal wirings, and
   the through hole is formed to avoid overlapping at least a portion of an area between end portions of the pair of second signal wirings in the planar view.

6. The optical module according to claim 1, wherein
the through hole of the second ground plane has a shape
in which the width gradually narrows in a direction in
which the second signal wiring extends from a tip
thereof, and
an overlapping area, in the planar view, of the end portion
of the second signal wiring and the second ground
plane, which is adjacent to the through hole, gradually
increases in the direction in which the second signal
wiring extends from the tip thereof.

7. The optical module according to claim 1, wherein
the width of the end portion of the second signal wiring
is wider than that of the signal electrode.

8. The optical module according to claim 1, wherein
the wide portion of the first signal wiring is located at a
position not overlapping the through hole of the second
ground plane in the planar view.

\* \* \* \* \*